United States Patent [19]

Iwase et al.

[11] Patent Number: 5,453,956
[45] Date of Patent: Sep. 26, 1995

[54] LOAD GENERATOR USED IN SEMICONDUCTOR MEMORY DEVICE

[75] Inventors: Akihiro Iwase; Teruo Seki; Masaharu Kagohashi, all of Kasugai, Japan

[73] Assignees: Fujitsu Limited, Kanagawa; Fujitsu VLSI Limited, Aichi, both of Japan

[21] Appl. No.: 382,408

[22] Filed: Feb. 1, 1995

[30] Foreign Application Priority Data

Mar. 15, 1994 [JP] Japan ................... 6-044344

[51] Int. Cl.$^6$ .......................... G11C 11/40; G11C 13/00
[52] U.S. Cl. ............... 365/226; 365/189.09; 365/230.01
[58] Field of Search .................... 365/226, 227, 365/189.01, 230.01, 189.09

[56] References Cited

U.S. PATENT DOCUMENTS 5,168,466  12/1992  Kuo et al. ........................... 365/185

*Primary Examiner*—Terrell W. Fears
*Attorney, Agent, or Firm*—Nikaido, Marmelstein, Murray & Oram

[57] ABSTRACT

A load generator is disclosed, which controls the voltage swing of the complementary logic signals generated in a semiconductor memory device. The load generator includes a first load circuit for controlling the potential levels of the signals appearing on a pair of complementary input signal lines. The first load circuit includes a first and second voltage dividers connected to the complementary input signal lines. Each of the first and second voltage dividers include a first voltage dividing transistor and a first voltage dividing resistive element connected in series between the semiconductor's low and high potential power supplies. The two first voltage dividing transistors are connected to each other in such a manner that a voltage, divided by one of the two transistors, is applied to the gate of the other transistor. The load generator further includes a second load circuit for controlling the potential levels of the signals appearing on a pair of complementary output signal lines. The second load circuit includes a third and fourth voltage dividing circuits associated with the first and second voltage dividing circuits and connected to the complementary output signal lines, respectively. Each of the third and fourth voltage dividing circuits includes a second voltage dividing transistor and a second voltage dividing resistive element, connected in series between the low and high potential power supplies.

20 Claims, 5 Drawing Sheets

LOAD GENERATOR USED IN SEMICONDUCTOR MEMORY DEVICE

BACKGROUND OF THE INVENTION

1. Field of the Invention

The present invention relates generally to a load generator and a semiconductor memory device using the load generator, and in particular to the control of voltage swings in logic signals transmitted to a pair of complementary signal lines.

2. Description of the Related Art

One way to increase the speed of a semiconductor memory device is to increase the rate which data is read from the memory device. Past attempts at increasing data read rates have focused on reducing the voltage swing in complimentary logic signals transmitted on a pair of data buses (i.e., on a complementary signal line pair). This shortens the time necessary to invert the complementary signals, in effect, increasing data read rates. One type of conventional semiconductor memory device accomplishes this by using a load generator.

FIG. 1 schematically illustrates a typical circuit arrangement for a random access memory (RAM) device. The circuit includes a memory cell array 50 formed from two-dimensionally arranged memory cells (not shown). Each of these memory cells stores 1 bit of data. As is well known in this field, the data reading and/or writing operations are carried out with respect to selected memory cells. The sense amplifier 51, coupled to the memory cell array 50, amplifies data read from the selected memory cells on bit lines (not shown). The sense amplifier 51 couples to a sense buffer 52 via a pair of data buses DB and /DB. A load generator 54 is connected in parallel along data buses DB and /DB, between the sense amplifier 51 and sense buffer 52. The data buses DB and /DB transfer the data read from the memory cells to the sense buffer 52.

The potentials of data buses DB and /DB reflect the potential the data read from the memory cells. For example, when the data read from the memory cell corresponds to "0", the potential of the data bus DB goes low and the potential of the data bus /DB goes high. Conversely, when the data read from the memory cell corresponds to "1", the potential of the data bus DB goes high, and the potential of the data bus /DB goes low. As described above, the read data read from the memory cells is output as the complementary signals appearing on the pair of data buses DB and /DB. The sense buffer 52 and the output buffer 53 produce the output data "$D_{out}$" in response to the complementary signals.

The load generator 54 reduces the potential difference between the complementary signals appearing on the pair of data buses DB and /DB. In effect, the load generator 54 reduces the voltage swing of the complementary logic signals, shortening the time required to invert the level of the signals on the data buses DB and /DB.

In particular, when the voltage level of the data read from the selected memory cell is "0" the potential at the data bus DB is set low (e.g., to 0 volt) and the potential at the data bus /DB is set high (e.g., to 5 volts). If data, contained in the next cell read, is "1", the voltage potential on data bus DB has to be inverted low to high, while the voltage potential on the data bus /DB has to be inverted high to low. During the inversion process, neither the sense buffer 52 nor the output buffer 53 outputs data $D_{out}$. Accordingly, the larger the logic voltage swing of the complementary signals, the longer the time needed to invert later occurring complementary signals. Consequently, it is desirable to reduce the potential level difference in the complementary data bus signals by using the load generator 54 in order to achieve higher memory device speeds.

FIG. 2 roughly shows the circuit arrangement of the load generator 54 which has been proposed by Chul M. Jung et al., of SAMSUNG ELECTRONICS Company, in Symposium On VLSI Circuits held in 1993. The load generator 54 is composed of six enhancement type P-channel MOS transistors 61 to 66. The first to third PMOS transistors 61 to 63 are connected in series between the high potential power supply Vcc and the low potential power supply Vss. Similarly, the fourth to sixth PMOS transistors 64 to 66 are connected in series between the high potential power supply Vcc and the low potential power supply Vss.

The first and fourth PMOS transistors 61 and 64 each has its source connected to the high potential power supply Vcc and its gate connected to the low potential power supply Vss. As a result, the PMOS transistors 61 and 64 are continuously turned ON.

The third and sixth PMOS transistors 63 and 66 each has its drain connected to the low potential power supply Vss and its gate available to receive a control signal CS. The control signal CS is a chip select signal capable of enabling or disabling the RAM. When the control signal CS is set high, the RAM is disabled. Conversely, when the control signal CS is set low, the RAM is enabled. When the control signal CS is set low, the PMOS transistors 63 and 66 are turned ON, activating the load generator 54.

The second PMOS transistor 62 has its source connected to the drain of the first transistor 61, its drain connected to the source of the third transistor 63, and its gate connected to the drain of the fifth transistor 65. The fifth PMOS transistor 65 has its source connected to the drain of the fourth transistor 64, its drain connected to the source of the sixth transistor 66, and its gate connected to the drain of the second transistor 62. The data bus DB is connected to the node N1 between the first transistor 61 and the second transistor 62. The data bus /DB is connected to the node N2 between the fourth transistor 64 and the fifth transistor 65.

When the low-level control signal CS is input to the gates of the third and sixth transistors 63 and 66, all of the transistors 61 to 66 are activated ON. The potentials then at these nodes N1 and N2 are divided by the resistance values of the respective transistors 61 to 66 when activated. In particular, the divided voltage amounts depend on the relationship of channel widths W61 to W66 of the respective transistors 61 to 66. In the load generator shown in FIG. 2, the channel widths W61 to W66 are, for example, designed to satisfy the relationship:

$$W61 : W62 : W63 = W64 : W65 : W66 = 1 : 1 : 2.$$

The potentials at the nodes N1 and N2 are set to the potentials corresponding to the potential at which the sense amplifier 51 is most sensitive to the signals on the data buses.

Although the potential levels of the data buses DB and /DB are initially set approximately midway between high and low voltage potentials, the potential on the data bus changes in synchronism with the data read from the memory cell. When, for instance, the data of "1" is read, the potential at the data bus DB goes high and the potential at the data bus /DB goes low. Consequently, the current I62 flowing through the second transistor 62 increases, while the current I65 flowing through the fifth transistor 65 decreases. Accordingly, the drain voltage of the second transistor 62 is applied to the gate of the fifth transistor 65 and the drain voltage of the fifth transistor 65 is applied to the gate of the second transistor 62. As a result, the currents I62 and I65, initially set equal to each other, increase and decrease respectively, and remain constant thereafter. This produces the difference current "ΔI" between the increased current I62 and the decreased current I65. Accordingly, the potential at the node N1 increases and the potential at node N2 decreases due to the differential current ΔI. The new potential levels at nodes N1 and N2, i.e., the potential levels at the data buses DB and /DB, are maintained by the transistors 62 and 65.

Thereafter, if data representative of "0" is read from the memory cell, the potential levels on the data buses DB and /DB must be inverted. In particular, the potential at the data bus DB must be set to the potential lower than its initial potential by the voltage difference caused by the differential current ΔI, whereas the potential at the data bus /DB must be set to the potential higher than its initial potential by the voltage difference caused by the differential current ΔI.

One challenge involving the design of memory devices is that the output data $D_{out}$ from the RAM must often be supplied to semiconductor devices operating at different voltage potentials from that of the RAM. For example, the other devices could have a CMOS level specification corresponding to the logic voltage swing of 0 volt to 5 volts, or a TTL level specification corresponding to the logic voltage swing of 0.8 volts to 2.2 volts. In such a case, either the output signal from the RAM would have to be amplified, or the level of the output signal would have to be converted for its potential to correspond to that required by the other semiconductor devices.

However, it is difficult to amplify or convert the levels of signals which exhibit small voltage swings. Consequently, it is difficult to amplify or convert the complementary signals on the data buses DB and /DB. Thus, even when the difference between the potential levels at the data buses DB and /DB is reduced by employing the load generator 54, ostensively to shorten the time period required to invert the signals, the data reading operations will exhibit no increased speed if the output data $D_{out}$ must be amplified or its level converted.

SUMMARY OF THE INVENTION

Accordingly, it is a primary object of the present invention to provide a load generator which controls the voltage swing of complementary logic signals on a pair of signal lines without increasing the time needed to invert the signals. Another object of the present invention is to provide a semiconductor memory device using the above-described load generator.

To achieve the foregoing and other objects in accordance with the purpose of the present invention, an improved load generator is provided.

The load generator according to the present invention is provided between a pair of complementary input signal lines and a pair of complementary output signal lines. The load generator includes a first load circuit for controlling the potential levels of the complementary signals appearing on the pair of complementary input signal lines, and a second load circuit for controlling the potential levels of complementary output signals appearing on the pair of output signal lines.

The first load circuit includes a first and second voltage dividers respectively coupled to the complementary input signal lines. Each voltage divider includes a first voltage dividing transistor and a first voltage dividing resistive element connected in series between the low and high potential power supplies. Each of the first voltage dividing transistors in the first and second voltage dividers transmits a current in accordance with the potential level of the signal appearing on the associated complementary input signal line. The first voltage dividing transistors are connected to each other in such a manner that a voltage, divided by one of the first voltage dividing transistors, is applied to a control terminal of the other voltage dividing transistor.

The second load circuit includes a third and fourth voltage dividers, which are associated with the first and second voltage dividers, and which are connected to the complementary output signal lines, respectively. Each of the third and fourth voltage dividers includes a second voltage dividing transistor and a second voltage dividing resistive element, connected in series between the low and high potential power supplies. The driving capabilities of the second voltage dividing transistors in the third and fourth voltage dividers are different from those of the first voltage dividing transistors in the first and second voltage dividers. Each of the second voltage dividing transistors in the third and fourth voltage dividers has a control terminal connected to the control terminal of the associated first voltage dividing transistor.

BRIEF DESCRIPTION OF THE DRAWINGS

The features of the present invention that are believed to be novel are set fourth with particularity in the appended claims. The invention, together objects and advantages thereof, may best be understood by reference to the following description of the presently preferred embodiments together with the accompanying drawings in which:

DETAILED DESCRIPTION OF THE PREFERRED EMBODIMENTS

FIRST EMBODIMENT

Figure 1:
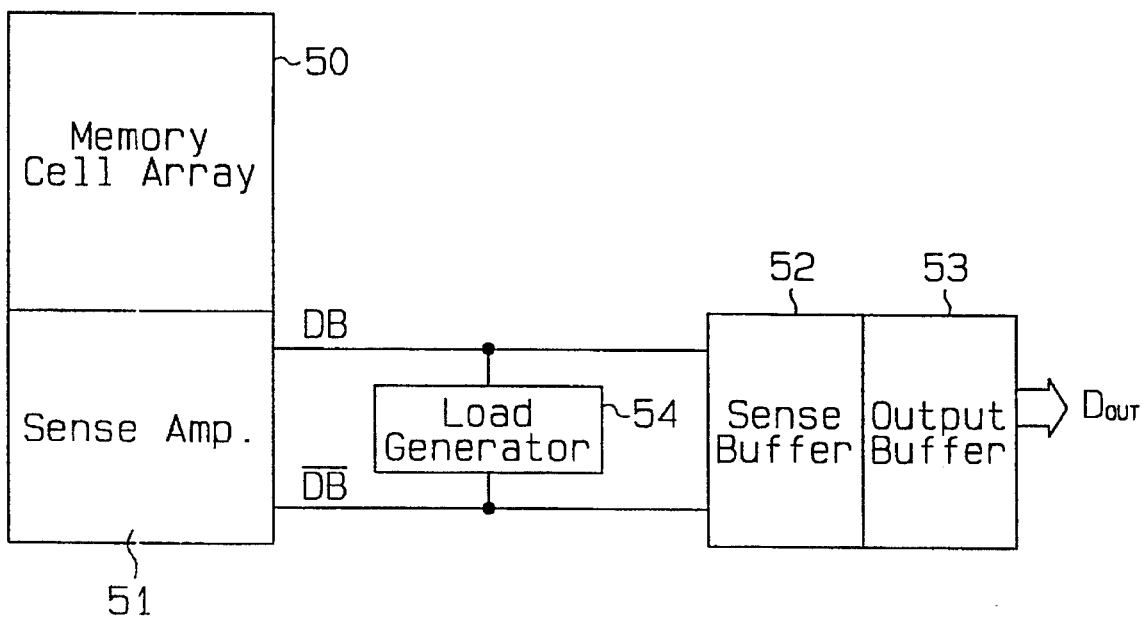
FIG. 1 is a circuit block diagram illustrating a conventional RAM.
Figure 2:
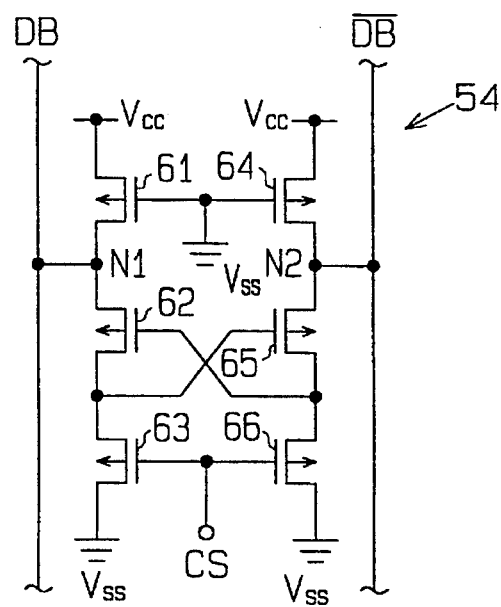
FIG. 2 is a circuit diagram illustrating a conventional load generator connected to a pair of data buses in the static RAM.
Figure 3:
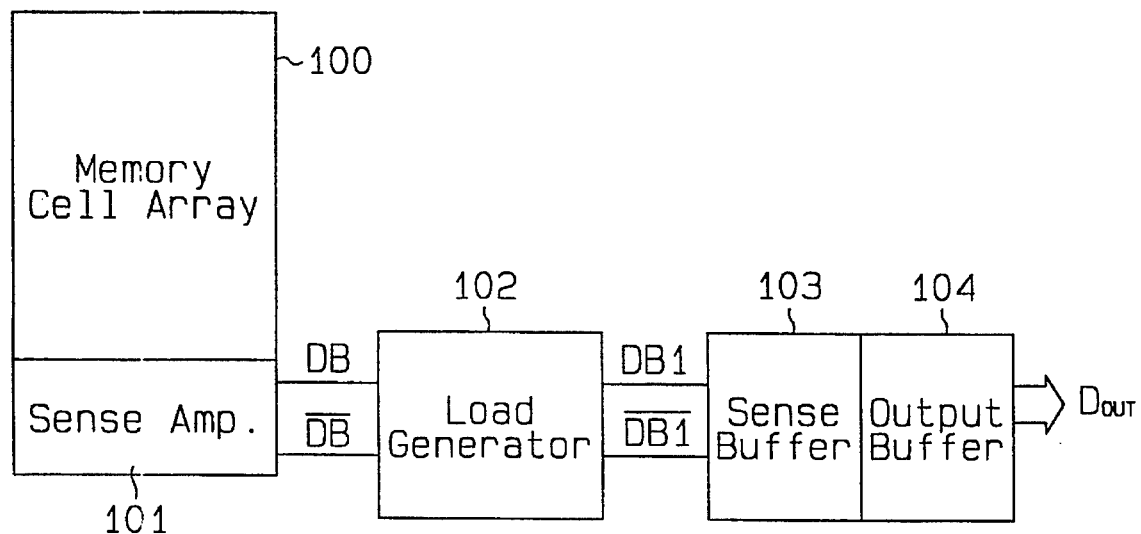
FIG. 3 is a bock diagram of a circuit illustrating a Random Access Memory (RAM) according to a first embodiment of the present invention.

A random access memory (RAM) as a semiconductor integrated circuit device according to a first preferred embodiment of the present invention will now be described referring to FIGS. 3 and 4. As shown in FIG. 3, the RAM formed on a semiconductor chip includes a memory cell array 100, a sense amplifier 101, a load generator 102, a sense buffer 103 and an output buffer 104.

The memory cell array 100 is formed using memory cells arranged in two dimensions (not shown). Each of these memory cells stores 1 bit of data. The sense amplifier 101 enters the data read from the selected memory cells via bit lines (not shown). The sense amplifier 101 amplifies complementary signals $D_{01}$ and $/D_{01}$, which correspond to the read bit data, and outputs the amplified complementary signals to the load generator 102 via a pair of data buses DB and /DB as complementary input signal lines. The load generator 102 is connected to the sense buffer 103 via a pair of data buses DB1 and /DB1 as complementary output signal lines. The load generator 102 controls the amplitudes of the complementary signals $D_{01}$ and $/D_{01}$, input from the sense amplifier 101. The complementary amplitude controlled signals $D_{01}$ and $/D_{01}$ are supplied as complementary signals $D_{02}$ and $/D_{02}$ to the sense buffer 103. The sense buffer 103 receives the complementary signals $D_{02}$ and $/D_{02}$ supplied from the load generator 102. The output buffer 104 supplies output data $D_{out}$ corresponding to these complementary signals $D_{02}$ and $/D_{02}$ to an external device (not shown).

Figure 4:
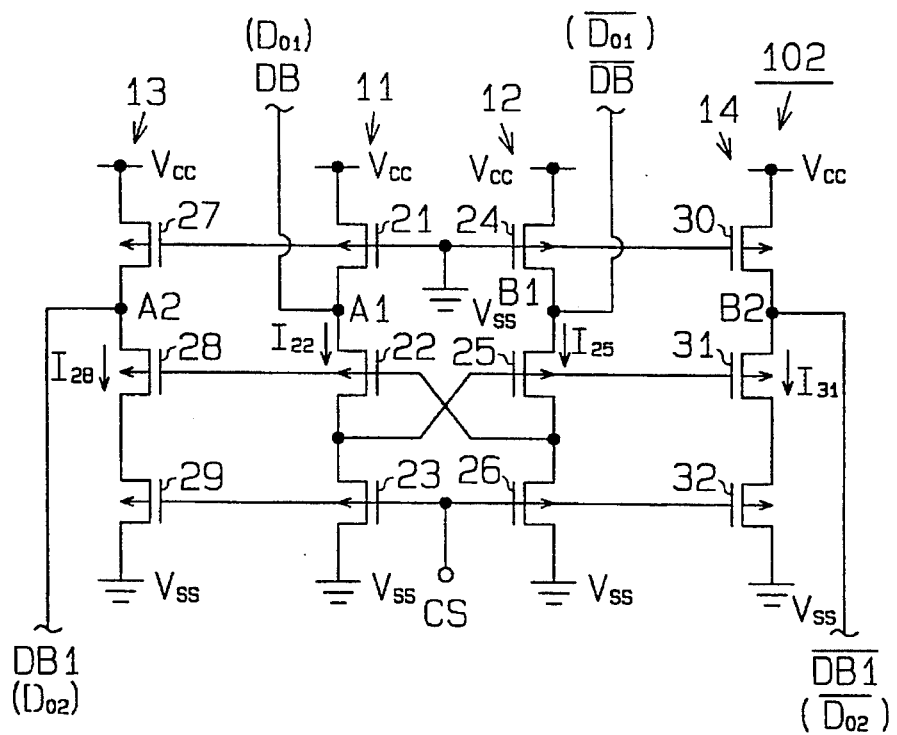
FIG. 4 is a circuit diagram illustrating a load generator according to a first embodiment of the present invention.

FIG. 4 represents a circuit arrangement of the load generator 102. The load generator 102 contains four transistor groups 11 to 14 each having three transistors. The first, second, third, and fourth transistor groups 11 to 14 serve as first, second, third, and fourth voltage dividing circuits more simply, as voltage dividers.

The first transistor group 11 includes three P-channel MOS transistors 21 to 23 connected in series between a high potential power supply Vcc and a low potential power supply Vss, i.e., ground. The first transistor 21 has a source connected to the high potential power supply Vcc, and a drain connected to the source of the second transistor 22. The second transistor 22 has a drain connected to the source of the third transistor 23. The third transistor 23 has a drain connected to the low potential power supply Vss. Vss, is in this embodiment represented as at ground potential, but may vary according to different design parameters.

The second transistor group 12 includes three P-channel MOS transistors 24 to 26 connected in series between the high potential power supply Vcc and the low potential power supply Vss. The fourth transistor 24 has a source connected to the high potential power supply Vcc and a drain connected to the source of the fifth transistor 25. The fifth transistor 25 has a drain connected to the source of the sixth transistor 26. The sixth transistor 26 has a drain connected to the low potential power supply Vss.

The gate of the first transistor 21 and the gate of the fourth transistor 24 are connected to the low potential power supply Vss. As a result, both of these transistors 21 and 24 are turned ON. The gate of the third transistor 23 and the gate of the sixth transistor 26 are connected to each other, and receive the above-described control signal CS. Consequently, when the control signal CS is set low, the transistors 23 and 26 are both activated ON. The gate of the second transistor 22, as a control terminal, is connected to the drain of the fifth transistor 25, whereas the gate of the fifth transistor 25, as a control terminal, is connected to the drain of the second transistor 22. Both of the second and fifth transistors 22 and 25 function as voltage-dividing transistors.

A node A1 between the first transistor 21 and the second transistor 22 in the first transistor group 11 is connected to the sense amplifier 101 via the data bus DB. A node B1 between the fourth transistor 24 and the fifth transistor 25 in the second transistor group 12 is connected to the sense amplifier 101 via the data bus /DB. The first and second transistor groups 11 and 12 form a first load circuit.

The channel widths W21 and W22 of the transistors 21 and 22 in the first transistor group 11 and the channel widths W24 and W25 of the transistors 24 and 25 in the second transistor group 12 are equal to one another, so that these transistors 21, 22, 24 and 25 have nearly identical drive capabilities (i.e., identical fanout characteristics). The channel width W23 of the third transistor 23 in the first group 11 and the channel width W26 of the sixth transistor 26 in the second group 12 are twice as large as those of the transistors 21, 22, 24 and 25. Accordingly, the drive capabilities of the third and sixth transistors 23 and 26 is twice that of the transistors 21, 22, 24 and 25. Therefore, the relationship among the channel widths W21 to W26 is given as follows:

$$W21 : W22 : W23 = W24 : W25 : W26 = 1 : 1 : 2.$$

The third transistor group 13 includes three P-channel MOS transistors 27 to 29 connected in series between the high potential power supply Vcc and the low potential power supply Vss. The seventh transistor 27 has a source connected to the high potential power supply Vcc and a drain connected to the source of the eighth transistor 28. The eighth transistor 28 functions as a voltage divider and has a drain connected to the source of the ninth transistor 29. The ninth transistor 29 has a drain connected to the low potential power supply Vss.

The fourth transistor group 14 includes three P-channel MOS transistors 30 to 32 connected in series between the high potential power supply Vcc and the low potential power supply Vss. The tenth transistor 30 has a source connected to the high potential power supply Vcc and a drain connected to the source of the eleventh transistor 31. The eleventh transistor 31 functions as a voltage divider, and has a drain connected to the source of the twelfth transistor 32. The twelfth transistor 32 has a drain connected to the low potential power supply Vss.

The gate of the seventh transistor 27 and the gate of the tenth transistor 30 are connected to each other, and are also connected to the gates of the first and fourth transistors 21 and 24. Accordingly, the seventh and tenth transistors 27 and 30 turn ON together with the first and fourth transistors 21 and 24. The gate of the ninth transistor 29 and the gate of the twelfth transistor 32 are connected to each other, and are also connected to the gates of the third and sixth transistors 23 and 26. Therefore, when the control signal CS is set low, the transistors 29 and 32 turn ON together with the transistors 23 and 26.

The gate of the eighth transistor 28 is connected to the drain of the fifth transistor 25. The gate of the eleventh transistor 31 is connected to the drain of the second transistor 22. A node A2 between the transistors 27 and 28 in the third group 13 is connected to the sense amplifier 103 via the data bus DB1. A node B2 between the transistors 30 and 31 in the fourth group 14 is connected to the sense buffer 103 via the data bus /DB1. The third and fourth transistor groups 13 and 14 form a second load circuit.

The channel width W28 of the eighth transistor 28 is twice as large as the channel width W22 of the second transistor 22. This allows the eighth transistor 28 to have a drive capability (i.e., fanout) twice as large as the second transistor 22. Since the gate voltage of the transistor 22 is equal to that of the transistor 28, the current I28 flowing through the eighth transistor 28 is two times higher than the current I22 flowing through the second transistor 22.

The channel width W31 of the eleventh transistor 31 is twice as large as the channel width W25 of the fifth transistor 25. This makes the drive capability (i.e., fanout) of the transistor 31 is twice that of the transistor 25. Since the gate voltage of the transistor 25 is equal to that of the transistor 31, the current I31 flowing through the eleventh transistor 31 is two times higher than the current I25 flowing through the fifth transistor 25.

The channel width W27 of the seventh transistor 27 is made twice as large as the channel width W21 of the first transistor 21, making the drive capability (i.e., fanout) of the ninth transistor 27 is two times higher than that of the transistor 21. Moreover, the channel width W29 of the ninth transistor 29 is made twice as large as the channel width W23 of the third transistor 23. This makes the drive capability (i.e., fanout) of the transistor 29 twice as large as that of the transistor 23.

The relationship among the channel widths W21 to W23 of the respective transistors 21 to 23 in the first group 11 is given as follows:

$$W21 : W22 : W23 = 1 : 1 : 2.$$

Accordingly, the relationship among the channel widths W27 to W29 of the respective transistors 27 to 29 in the third group 13 is given as follows:

$$W27 : W28 : W29 = 2 : 2 : 4.$$

As a consequence, the relationship among the channel widths W21 to W23 and W27 to W29 is given as follows:

$$W21 : W22 : W23 : W27 : W28 : W29 = 1 : 1 : 2 : 2 : 2 : 4.$$

The channel width W30 of the tenth transistor 30 is made twice as large as the channel width W24 of the fourth transistor 24.

Consequently, the drive capability (i.e., fanout) of the tenth transistor 30 is twice that of the fourth transistor 24. Similarly, the channel width W32 of the twelfth transistor 32 is twice as large as the channel width W26 of the sixth transistor 26, so that the drive capability (i.e., fanout) of the twelfth transistor 32 is twice that of the sixth transistor 26.

The relationship among the channel widths W24 to W26 of the respective transistors 24 to 26 in the second group 12 is given as follows:

$$W24 : W25 : W26 = 1 : 1 : 2.$$

Accordingly, the relationship among the channel widths W30 to W32 of the respective transistors 30 to 32 in the fourth group 14 is given as follows:

$$W30 : W31 : W32 = 2 : 2 : 4.$$

As a consequence, the relationship among the channel widths W24 to W26 and W30 to W32 is given as follows:

$$W24 : W25 : W26 : W30 : W31 : W32 = 1 : 1 : 2 : 2 : 2 : 4.$$

Consequently, the following equation can be obtained:

$$W21 : W22 : W23 : W24 : W25 : W26 : W27 : W28 : W29 : W30 : W31 : W32 = 1 : 1 : 2 : 1 : 1 : 2 : 2 : 2 : 4 : 2 : 2 : 4.$$

The relationship among the resistance values of the transistors 21 to 32, when turned on, depends on the above-described relationship among the channel widths W21 to W32. The resistance values of the respective transistors 21 to 23 and 24 to 26 determine the potentials at the nodes A1 and B1. The determined potential each corresponds to a first level inverting center potential, which is regarded as the symmetrical center when the levels of the complementary signals $D_{01}$ and $/D_{01}$ on the data buses DB and /DB are inverted.

The respective transistors are designed in such a manner that the first center potential is coincident with such a potential where the sense amplifier 101 can have the highest sensitivity. Similarly, the resistance values of the respective transistors 27 to 29 and 30 to 32 determine the potentials at the nodes A2 and B2. The determined potentials correspond to a second level inverting center potential, which is regarded as the symmetrical center when the levels of the complementary signals $D_{02}$ and $/D_{02}$ on the data buses DB1 and /DB1 are inverted. The respective transistors are designed in such a manner that the second center potential is coincident with such a potential where the sense buffer 103 can have the highest sensitivity.

When the low level control signal CS is supplied to the RAM in order to read out data stored in the memory array 100, the third, sixth, ninth and twelfth transistors 23, 26, 29 and 32 turn ON. This allows currents to flow through the respective transistor groups 11 to 14, and the potentials at the respective nodes A1, B1 and A2, B2 are initialized to the level inverting center potentials for the corresponding signals $D_{01}$, $/D_{01}$, $D_{02}$ and $/D_{02}$.

When the data of "0" is read from a memory cell under the initial state, the sense amplifier 101 outputs the complementary signals $D_{01}$ and $/D_{01}$ indicative of the data "0" to the load generator 102. Accordingly, the potential at the data bus DB is set low and the potential at the data bus /DB is set high.

In response to setting the potential at the data bus DB to the low level, the current I22 flowing through the second transistor 22 decreases. On the other hand, in response to setting the potential at the data bus /DB to the high level, the current I25 flowing through the fifth transistor 25 increases. Thus, the current I25 becomes higher than the current I22.

The potential at the node A1 drops from the initial potential by the voltage drop caused by the decreased value ΔI of the current I22. On the other hand, the potential at the node B1 rises from the initial potential by the voltage rising caused by the increased value ΔI of the current I25. The potential difference between the potentials at the nodes A1 and B1, which corresponds to 2ΔI, is set as the voltage swing for the complementary logic signals $D_{01}$ and $/D_{01}$.

The gate potential of the second transistor 22 is equal to that of the eighth transistor 28. The ratio of the second transistor's channel width W22 to the eighth transistor's channel width W28 is set to ½ (i.e., W22 : W28=1 : 2). Accordingly, the current I28 flowing through the eighth transistor 28 is twice that of the current I22 flowing through the second transistor 22. As the current I22 decreases, therefore, the potential at the node A2 is lowered by the voltage drop caused by the current I28, which tend to decrease more than the current I22. In other words, the potential at node A2 decreases by a larger amount than the potential at node A1.

The gate potential of the fifth transistor 25 is equal to that of the eleventh transistor 31. The ratio of the fifth transistor's channel width W25 to the eleventh transistor's channel width W31 is set to 1 : 2 (i.e., W25 : W31=1 : 2). Accordingly, the current I31 flowing through the eleventh transistor 31 is two times higher than the current I25 flowing through the fifth transistor 25. As the current I25 increase, therefore, the potential at the node B2 increases due to the voltage rise caused by the current I31, which tends to increase more than the current I25. Thus, the potential at the node B2 increases by an amount larger than the potential at node B1.

As a result, the potential difference between the nodes A2 and B2 becomes approximately twice as large as that between the nodes A1 and B1. In other words, the voltage swing of the complementary logic signals $D_{02}$ and $/D_{02}$ appearing on the pair of data buses DB1 and /DB1 is set approximately twice as large as that of the complementary signals $D_{01}$ and $/D_{01}$ appearing on the pair of data buses DB and /DB. Thus, the complementary signals $D_{02}$ and $/D_{02}$ having the larger voltage swing are supplied to the sense buffer 103.

When data representing "1" is then read from another memory cell, the sense amplifier 101 outputs the complementary signals $D_{01}$ and $/D_{01}$ indicative of the data "1" to the load generator 102. Accordingly, the potential at the data bus DB goes high and the potential at the data bus /DB goes low.

In response to setting the data bus DB high, the current I22 flowing through the second transistor 22 increases. On the other hand, in response to setting the data bus /DB low, the current I25 flowing through the fifth transistor 25 decreases. Thus, the current I22 is, in this situation, higher than the current I25.

The potential at the node A1 rises from its initial potential by the voltage rise caused by the increased value ΔI of the current I22, whereas the potential at the node B1 drops from its initial potential by the voltage drop caused by the decreased value ΔI of the current I25. The potential difference between the nodes A1 and B1, which corresponds to 2ΔI, is set as the logic voltage swing of the complementary signals $D_{01}$ and $/D_{01}$.

The gate potential of the second transistor 22 is equal to that of the eighth transistor 28. The ratio of the second transistor's channel width W22 to the eighth transistor's channel width W28 is set to 1 : 2 (i.e., W22 : W28=1 : 2). As a consequence, the current I28 flowing through the eighth transistor 28 is twice that of the current I22 flowing through the second transistor 22. As the current I22 increases, the potential at the node A2 increases due to the voltage rise corresponding to the current I28, which tends to increase more than does the current I22. In other words, the potential at the node A2 increases by an amount larger than the potential at node A1.

Similarly, the gate potential of the fifth transistor 25 is equal to that of the eleventh transistor 31. The ratio of the fifth transistor's channel width W25 to the eleventh transistor's channel width W31 is set to 1 : 2 (i.e., W25 : W31=1: 2). Accordingly, the current I31 flowing through the eleventh transistor 31 is two times higher than the current I25 flowing through the fifth transistor 25. As the current I25 decreases, the potential at the node B2 is lowered by the voltage drop caused by the current I31 which tends to decrease more than the current I25. In other words, the potential at the node B2 is lowered by an amount larger than that of the potential at node B1.

Thus, the potential difference between the nodes A2 and B2 becomes approximately twice as large as that between the nodes A1 and B1. In other words, the voltage swing of the complementary logic signals $D_{02}$ and $/D_{02}$ appearing on the pair of data buses DB1 and /DB1 is set approximately twice as large as that of the complementary signals $D_{01}$ and $/D_{01}$ appearing on the pair of data buses DB and /DB. Thus, the sense buffer 103 receives the complementary logic signals $D_{02}$ and $/D_{02}$ having the larger voltage swing.

Since the gates of the transistors 22 and 28 are connected and since the gates of the transistors 25 and 31 are, the inversion of the complementary signals $D_{02}$ and $/D_{02}$ appearing on the pair of data buses DB1 and /DB1 is substantially synchronized with the inversion of the complementary signals $D_{01}$ and $/D_{01}$ appearing on the pair of data buses DB and /DB. This prevents or suppresses the inversion of the secondary complementary signals $D_{02}$ and $/D_{02}$ from being delayed with respect to the inversion of the primary signals $D_{01}$ and $/D_{01}$.

The complementary signals $D_{02}$ and $/D_{02}$ appearing on the data buses DB1 and /DB1 are output as data $D_{out}$ via the sense buffer 103 from the output buffer 104. Since the voltage swing of the complementary logic signals $D_{02}$ and $/D_{02}$ is sufficiently large, the time period required to convert the signal levels in the sense buffer 103 can be considerably shortened.

According to this embodiment, the current I28 flowing through the transistor 28 in the third group 13 is two times higher than the current I22 flowing through the transistor 22 in the first group 11, while the current I31 flowing through the transistor 31 in the fourth group 14 is two times higher than the current I25 flowing through the transistor 25 in the second group 12. The potential difference between the nodes A2 and B2 is set twice as large as the potential difference between the nodes A1 and B1. Accordingly, the voltage swing of the complementary logic signals $D_{02}$ and $/D_{02}$ on the data buses DB1 and /DB1 becomes approximately twice as large as that of the complementary signals $D_{01}$ and $/D_{01}$ on data buses DB and /DB. This shortens the time required by the sense buffer 103 or the output buffer 104 to convert the signal levels. Moreover, it allows high speed data reading operations from the memory cell array 100.

Furthermore, since it is possible to create a large voltage swing for complementary signals $D_{02}$ and $/D_{02}$ on data buses DB1 and /DB1, it may be possible to set the smaller logic voltage swing of the complementary signals $D_{01}$ and $/D_{01}$ supplied to the pair of data buses DB and /DB from the sense amplifier 101. If the logic voltage swing of the complementary signals $D_{01}$ and $/D_{01}$ is set smaller than a normal setting of the voltage swing, it will shorten the time it takes to invert the complementary signals.

The load generator 102 according to this embodiments is formed by only twelve PMOS transistors 21 to 32. Even should the characteristics of the respective semiconductor chips fluctuate with respect to the manufacturing lots, the desired relationship of the potentials at the nodes A1, A2, B1 and B2 can be maintained in the respective semiconductor chips, since the relationship among the transistors' channel widths W21 to W32 remains constant irrespective of the manufacturing lots.

SECOND EMBODIMENT

A load generator according to a second embodiment of the present invention will now be described referring to FIG. 5. It should be noted that the same reference numerals as shown in FIG. 4 will be employed as those for the same or similar circuit elements in FIG. 5 to avoid repeating the same descriptions.

The load generator according to the second embodiment is substantially the same as the first embodiment, except that the seventh and tenth transistors 27 and 30 are respectively separated from the first and fourth transistors 21 and 24. The gates of the seventh and tenth transistors 27 and 30 are connected to the gates of the first and fourth transistors 21 and 24 as in the first embodiment.

Figure 5:
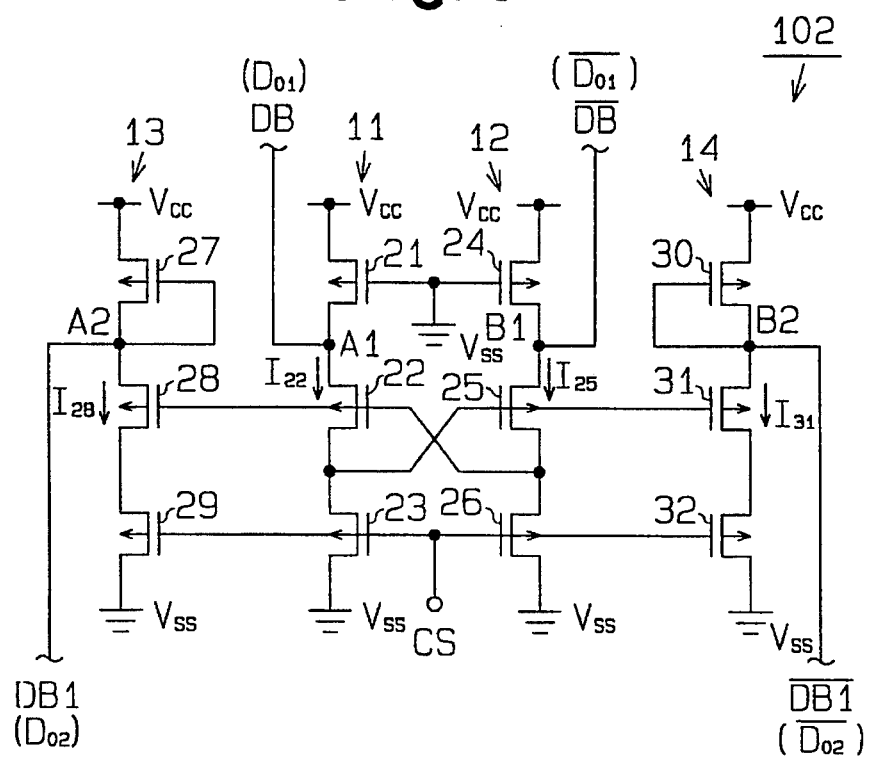
FIG. 5 is a circuit diagram illustrating a load generator according to a second embodiment of the present invention.

As shown in FIG. 5, in this second embodiment, the seventh transistor 27 of the third transistor group 13 and the tenth transistor 30 of the fourth transistor group 14 each have a gate connected to a drain. The relationship among resistance values of the twelve transistors 21 to 32 in the second embodiment is the same as that of the first embodiment, allowing the load generator of the second embodiment to function similar to that of the load generator described in the first embodiment.

THIRD EMBODIMENT

A load generator according to a third embodiment of the present invention will now be described with reference to FIG. 6. Those circuit elements illustrated in FIG. 6 which are the same as those illustrated in FIG. 4 have been given the same reference numbers to avoid repeating their description.

The load generator of the third embodiment is substantially the same as that of the first embodiment, except that the gates of the transistors 21, 24, 27 and 30 receive the control signal CS. The gates of the transistors 21, 24, 27 and 30 are connected to the low potential power supply Vss in the first embodiment.

Figure 6:
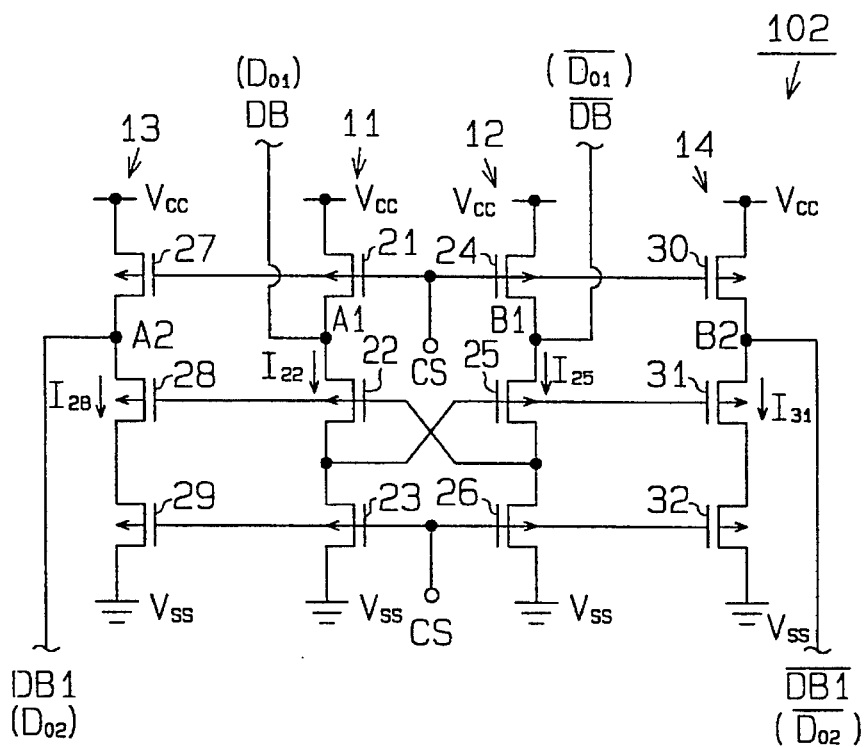
FIG. 6 is a circuit diagram illustrating a load generator according to a third embodiment of the present invention.

As shown in FIG. 6, in this third embodiment, the gates of the first, fourth, seventh and tenth PMOS transistors 21, 24, 27, and 30 are mutually connected to one another, and receive the above-described control signal CS as input. When the control signal CS is set high, these transistors 21, 24, 27 and 30 are turned OFF. Accordingly, it is possible to suppress power consumption when the RAM is disabled in response to the high level control signal CS. When the control signals CS is set low, these transistors 21, 24, 27 and 30 are turned ON, so that the load generator of this third embodiment functions in the same manner as the load generator of the first embodiment.

It should be understood that the respective gates of the third, sixth, ninth and twelfth PMOS transistors 23, 26, 29, 32 may be connected with respect to the low potential power supply Vss.

FOURTH EMBODIMENT

A load generator according to a fourth embodiment of the present invention will now be described with reference to FIG. 7. It should be noted that the same reference numerals shown in FIG. 4 will be employed as those for denoting the same or similar circuit elements in FIG. 7 in order to avoid the same explanations.

The load generator according to this fourth embodiment is substantially the same as that of the first embodiment, except that the seventh and tenth PMOS transistors 27 and 30 of the first embodiment are substituted by enhancement type N-channel MOS transistors 40 and 41, respectively.

Figure 7:
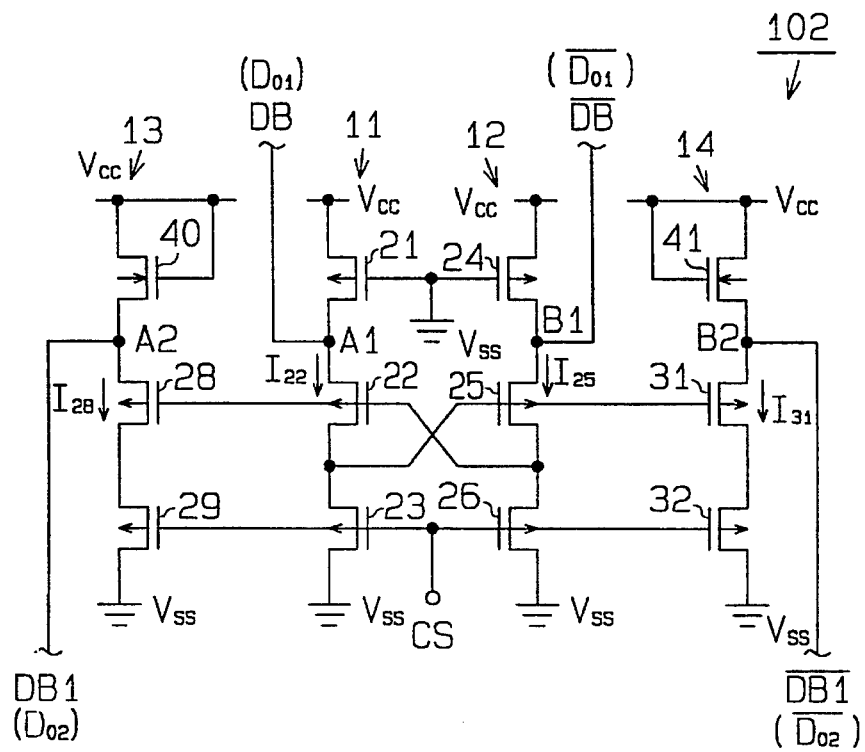
FIG. 7 is a circuit diagram illustrating a load generator according to a fourth embodiment of the present invention.

As shown in FIG. 7, in the load generator 102 according to the fourth embodiment, each of the NMOS transistors 40 and 41 has a gate and a drain which are commonly connected to the high potential power supply Vcc. Irrespective of the manufacturing lots of the semiconductor chips, the relationship is constant among the channel widths W22, W25, W28 and W31 of the second, fifth, eighth and eleventh transistors 22, 25, 28, and 31 respectively. Accordingly, the ratio of the voltage swing of the complementary logic signals at the nodes A2 and B2 to the logic voltage swing of the complementary signals input into the nodes A1 and B1 is constant. In addition, the level inverting center potential of the complementary logic signals output from the nodes A2 and B2 can be set to a desired potential level by changing the channel widths of the NMOS transistors 40 and 41. According to this circuit arrangement, therefore, it is easy to set the level inverting center potential of the complementary output signals $D_{O2}$ and $/D_{O2}$ to maximize the sensitivity of the sense buffer 103.

In this fourth embodiment, the ninth and twelfth PMOS transistors 29 and 32 may be replaced by NMOS transistors. Furthermore, the PMOS transistors 28, 29, 31, 32 belonging to the third and fourth groups 13 and 14 may be substituted by NMOS transistors.

FIFTH EMBODIMENT

A load generator according to a fifth embodiment of the present invention will now be described referring to FIG. 8. The same reference numerals indicated in FIG. 4 will be employed as those for denoting the same or similar circuit elements in FIG. 8 in order to avoid the same explanations.

Figure 8:
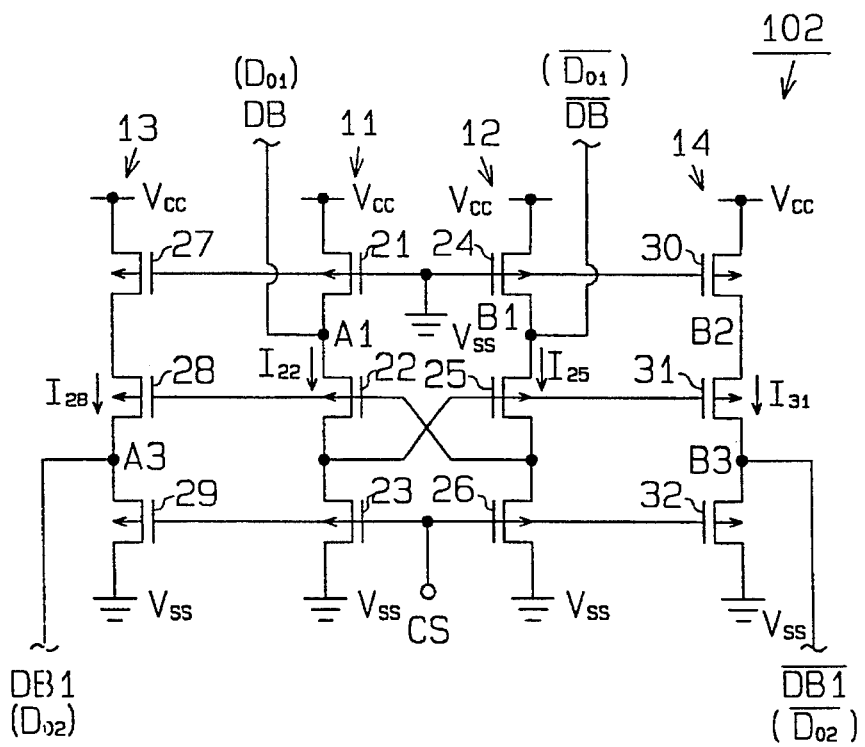
FIG. 8 is a circuit diagram illustrating a load generator according to a fifth embodiment of the present invention.

As shown in FIG. 8, in the load generator 102 according to the fifth embodiment, the data buses DB1 and /DB1 connected to the sense buffer 103 are respectively connected to the node A3 between the eighth and ninth transistors 28 and 29, and the node B3 between the eleventh and twelfth transistors 31 and 32. With such a circuit arrangement, it is possible to set the level inverting center potential for the complementary signals $D_{O2}$ and $/D_{O2}$ to a level different from that of the level inverting center potential for the complementary signals $D_{O1}$ and $/D_{O1}$. Consequently, the load generator shown in FIG. 8 can shift the level inverting center potential of the complementary output signals $D_{O2}$ and $/D_{O2}$ from that of the complementary input signals $D_{O1}$ and $/D_{O1}$, while suppressing the voltage swing of the complementary logic input signals $D_{O1}$ and $/D_{O1}$ beside controlling the voltage swing of the complementary logic output signals $D_{O2}$ and $/D_{O2}$.

Occasionally, the potential maximizing the sensitivity of the sense amplifier 101 is different from that maximizing the sensitivity of the sense buffer 103. According to the fifth embodiment, since the level inverting center potential of the complementary output signals $D_{O2}$ and $/D_{O2}$ output to the sense buffer 103 can be changed, the load generator is capable of being used even when the signal transfer efficiency from the input data buses DB and /DB toward the output data buses DB1 and /DB1 is lowered to delay the data output.

By redesigning the channel widths of the respective transistors in the load generator according to the first embodiment as shown in FIG. 4, the effects and merits achieved by the load generator of the fifth embodiment can be realized in the load generator of the first embodiment. For instance, the relationship among the channel widths of the transistors 27 to 29 and 30 to 32 in the third and fourth transistor groups 13 and 14 may be changed as follows:

W27 : W28 : W29=W30 : W31 : W32=3 : 2 : 4.

In this manner, the level inverting center potential for the complementary signals $D_{O2}$ and $/D_{O2}$ at the data buses DB1 and /DB1 can be made coincident with the potential needed to maximize the sensitivity of the sense buffer 103. Similarly, in the first embodiment, the channel widths of the transistors 21 to 23 and 24 to 26, belonging to the first and second transistor groups 11 and 12, may be set in such a manner that the level inverting center potential of the complementary input signals $D_{01}$ and $/D_{01}$ matches the potential at which the sense amplifier 101 has its maximum sensitivity. This improves the transfer efficiency of the complementary signals from the input data buses DB and /DB to the output data buses DB1 and /DB1, increasing data output operation speed.

SIXTH EMBODIMENT

A load generator according to a sixth embodiment of the present invention will now be described referring to FIG. 9. The same reference numerals indicated in FIG. 4 will be employed as those for denoting the same or similar circuit elements in FIG. 9 in order to avoid repeating the same explanations.

Figure 9:
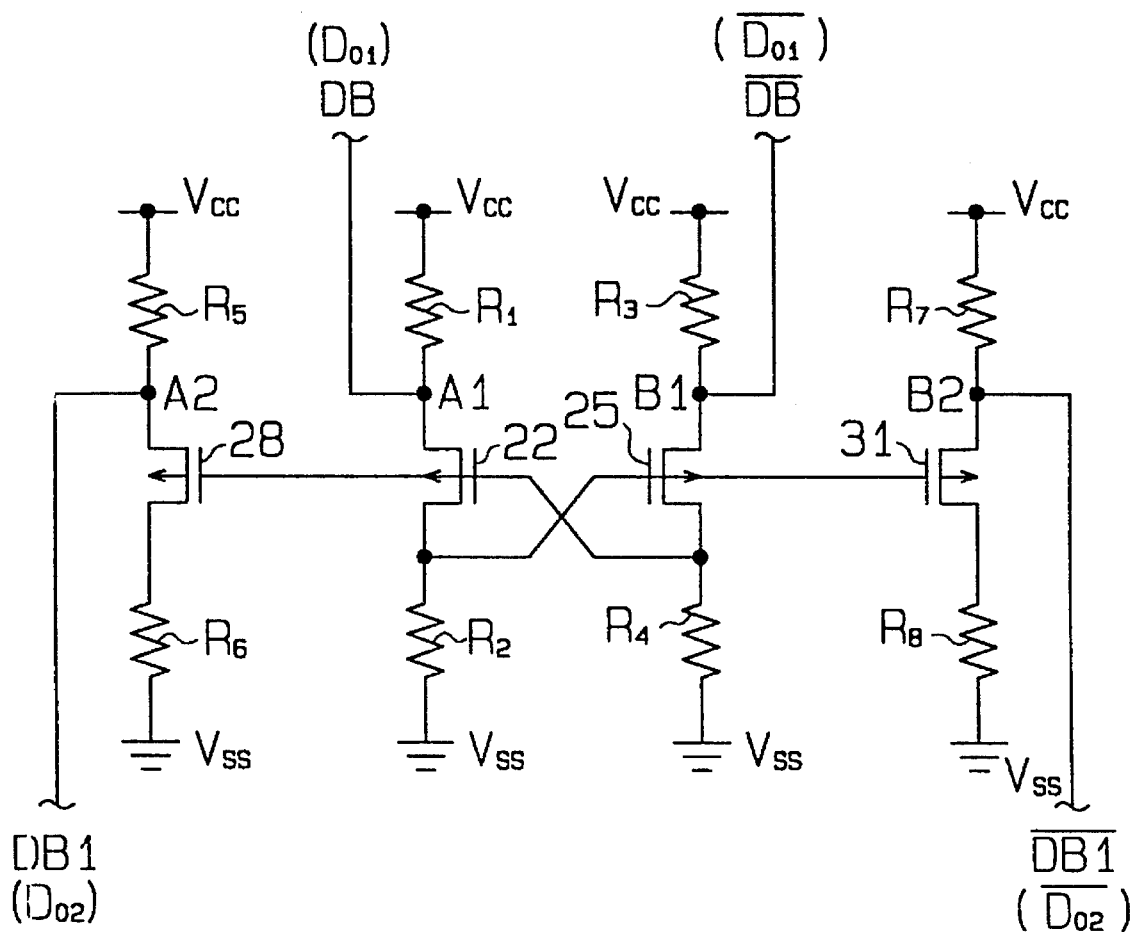
FIG. 9 is a circuit diagram illustrating a load generator according to a sixth embodiment of the present invention.

As shown in FIG. 9, the load generator of the sixth embodiment is different from that of the first embodiment, in that the eight PMOS transistors 21, 23, 24, 26, 27, 29, 30, and 32 in the first embodiment are replaced by resistor elements R1 to R8. The resistance values of the respective resistor elements R1 to R8 are set in such a manner that the level inverting center potential for the complementary input signals $D_{01}$ and $/D_{01}$ matches the potential at which the sense amplifier 101 maximizes its sensitivity. These resistance values are also set so that the level inverting center potential for the complementary output signals $D_{02}$ and $/D_{02}$ matches the potential at which the sense buffer 103 maximizes its sensitivity.

Alternatively, only some of these eight PMOS transistors 21, 23, 24, 26, 27, 29, 30 and 32 employed in the first embodiment may be substituted by the resistor elements.

Although only several embodiments of the present invention have been described herein, it should be apparent to those skilled in the art that the present invention may be embodied in many other specific forms without departing from the spirit or scope of the invention. Particularly, it should be understood that the present invention may be embodied by way of the following manners.

The PMOS transistors 22, 25, 28 and 31 employed in the respective embodiments may be replaced by either NMOS transistors or bipolar transistors. When these PMOS transistors are replaced by the NMOS transistors, the control signal CS whose level is inverted through an inverter circuit should be supplied to the gates of the NMOS transistors.

The control signal CS need not be supplied to the gates of the PMOS transistors 23, 26, 29, and 32 in the first to fifth embodiments. These gate may be connected to the low potential power supply Vss.

All of the twelve PMOS transistors included in the load generators according to the first to fifth embodiments may be replaced by NMOS transistors. In this case, the control signal CS inverted through an inverter circuit should be supplied to some gates of the replacing NMOS transistors. Since the relationship among the channel widths of the NMOS transistors is constant irrespective of the manufacturing lots of the semiconductor chips, the relationship among the resistance values of these NMOS transistors when turned ON is also constant.

Although the load generator according to the present invention is connected to the data buses to couple the sense amplifier to the sense buffer, this load generator may be applied to a pair of bit lines as complementary signal lines.

The load generator according to the present invention may be applied to another type of semiconductor integrated circuit such as a ROM equipped with complementary signal lines.

Therefore, the present examples and embodiments are to be considered as illustrative and not restrictive and the invention is not to be limited to the details given herein, but may be modified within the scope of the appended claims.

What is claimed is:

1. A load generator for controlling the voltage swing of complementary logic signals generated in a semiconductor device between the potentials of a high and low voltage power supplies, said load generator comprising:

a first load circuit responsive to a first pair of complementary logic signals, for outputting a second pair of complementary logic signals, said first load circuit including a first and second voltage dividers, each having a transistor and a resistive element connected in series between the high and low voltage power supplies, wherein the gate potential of the transistor in each voltage divider is controlled by the reduced potential provided by the other voltage divider; and a second load circuit responsive to said second pair of complimentary logic signals output from the first load circuit, for outputting a third pair of complementary logic signals at voltage potentials different from those of said first complimentary logic signals, said second load circuit including a third and fourth voltage dividers, each having a transistor and a resistive element connected in series between the high and low voltage supplies, wherein the gate potential of the transistor in the fourth voltage divider is controlled by the transistor in said first voltage divider, and wherein the gate potential of the transistor in the third voltage divider is controlled by the transistor in said second voltage divider.

2. The load generator according to claim 1, wherein said resistive elements in said first and second load circuits are formed by transistors.

3. The load generator according to claim 1, wherein said transistors are MOS transistors; and wherein the channel width of each MOS transistor in said second load circuit is larger than the channel width of each MOS transistor in said first load circuit.

4. The load generator according to claim 1, wherein each of the transistors in said first and second load circuits is a P-channel type MOS transistor.

5. The load generator according to claim 1, wherein said first, second, third and fourth voltage dividers are respectively the first, second, third and fourth transistor groups, each composed of a plurality of MOS transistors connected in series between the low and high voltage power supplies.

6. The load generator according to claim 5, wherein the driving capability of the MOS transistors in said third and fourth transistor groups is greater than that of the MOS transistors in the first and second transistor groups.

7. The load generator according to claim 5, wherein the fanout capability of the MOS transistors in said third and fourth transistor groups is greater than the fanout capability of the MOS transistors of the first and second transistor groups.

8. The load generator according to claim 5, wherein all the MOS transistors in said first to fourth transistor groups are P-channel type MOS transistors.

9. The load generator according to claim 5, wherein a control signal is supplied to the gate of at least one of the MOS transistors in said first to fourth transistor groups.

10. The load generator according to claim 3, wherein the MOS transistor in said first voltage divider has a gate as a control terminal connected to the drain of the MOS transistor in said second voltage divider; and wherein the MOS transistor in said second voltage divider has a gate as a control terminal connected to the drain of the MOS transistor in said first voltage divider.

11. A circuit provided between a pair of complementary input signal lines and a pair of complementary output signal lines, and supplied with power from a low and high voltage power supplies, comprising:

a first load circuit for controlling potential levels of the complementary input signals on the pair of complementary input signal lines, said first load circuit including a first and second voltage dividers connected to the complementary input signal lines, respectively, each of said first and second voltage dividers including a first transistor and a first resistive element connected in series between the low and high voltage power supplies, wherein each first transistor in said voltage dividers has a control terminal receiving the reduced potential provided by the other voltage divider; and a second load circuit, coupled to said first load circuit, for controlling potential levels of the complementary output signals on the pair of complementary output signal lines, said second load circuit including a third and fourth voltage divider connected to the complementary output signal lines, respectively, each of said third and fourth voltage dividers including a second transistor and a second resistive element connected in series between the low and high voltage power supplies, wherein the second transistor in said third voltage divider has a control terminal receiving said reduced potential provided by said second voltage divider, wherein the second transistor in said fourth voltage divider has a control terminal receiving said reduced potential provided by said first voltage divider.

12. The circuit according to claim 11, wherein said resistive elements in said first and second load circuits are formed by transistors.

13. The circuit according to claim 11, wherein said first and second transistors are MOS transistors; and wherein the channel width of each second MOS transistor in said second load circuit is larger than the channel width of each first MOS transistor in said first load circuit.

14. The circuit according to claim 13, wherein the first MOS transistor in said first voltage divider has a gate as a control terminal connected to the drain of the MOS transistor in said second voltage divider; and wherein the first MOS transistor in said second voltage divider has a gate as a control terminal connected to the drain of the MOS transistor in said first voltage divider.

15. The circuit according to claim 11, wherein said first, second, third and fourth voltage dividers are respectively the first, second, third and fourth transistor groups, each composed of a plurality of MOS transistors connected in series between the low and high voltage power supplies.

16. The circuit according to claim 15, wherein the driving capability of the MOS transistors in said third and fourth transistor groups is greater than that of the MOS transistors in the first and second transistor groups.

17. The circuit according to claim 15, wherein a control signal is supplied to the gate of at least one of the MOS transistors in said first to fourth transistor groups.

18. A semiconductor memory device comprising:

a memory cell array for storing data;

a sense amplifier for amplifying the read data from said memory cell array;

a sense buffer;

an output buffer coupled to said sense buffer; and a load generator coupled to said sense amplifier via a pair of first data buses and to said sense buffer via a pair of second data buses, wherein said load generator includes:

a first load circuit responsive to a first pair of complementary logic signals on the first data buses, for outputting a second pair of complementary logic signals, said first load circuit including a first and second voltage dividers, each having a transistor and a resistive element connected in series between a high and low voltage power supplies, wherein the gate potential of the transistor in each voltage divider is controlled by the reduced potential provided by the other voltage divider; and a second load circuit responsive to said second pair of complimentary logic signals output from the first load circuit, for outputting a third pair of complementary logic signals at voltage potentials different from those of said first complimentary logic signals onto the second data buses, said second load circuit including a third and fourth voltage dividers, each having a transistor and a resistive element connected in series between the high and low voltage power supplies, wherein the gate potential of the transistor in the fourth voltage divider is controlled by the transistor in said first voltage divider, and wherein the gate potential of the transistor in the third voltage divider is controlled by the transistor in said second voltage divider.

19. The semiconductor memory device according to claim 18, wherein said resistive elements in said first and second load circuits are formed by transistors.

20. The semiconductor memory device according to claim 18, wherein said memory device is a random access memory.

* * * * *